United States Patent
Huang et al.

(10) Patent No.: US 9,825,117 B2
(45) Date of Patent: Nov. 21, 2017

(54) MIM/RRAM STRUCTURE WITH IMPROVED CAPACITANCE AND REDUCED LEAKAGE CURRENT

(71) Applicant: Taiwan Semiconductor Manufacturing Co., Ltd., Hsin-Chu (TW)

(72) Inventors: Jian-Shiou Huang, Fangliao Township (TW); Yao-Wen Chang, Taipei (TW); Hsing-Lien Lin, Hsin-Chu (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/392,169

(22) Filed: Dec. 28, 2016

(65) Prior Publication Data
US 2017/0110533 A1    Apr. 20, 2017

Related U.S. Application Data

(62) Division of application No. 14/316,910, filed on Jun. 27, 2014, now Pat. No. 9,543,375.

(51) Int. Cl.
*H01L 49/02*    (2006.01)
*H01L 23/522*    (2006.01)
(Continued)

(52) U.S. Cl.
CPC ........ *H01L 28/40* (2013.01); *H01L 21/02112* (2013.01); *H01L 21/02266* (2013.01);
(Continued)

(58) Field of Classification Search
CPC ............... H01L 28/40; H01L 21/31616; H01L 21/31645; H01L 21/02194;
(Continued)

(56) References Cited

U.S. PATENT DOCUMENTS 7,071,007 B2    7/2006  Tseng et al.
2004/0135186 A1    7/2004  Yamamoto
(Continued)

OTHER PUBLICATIONS

S.K. Ray, et al.; "Nanocrystals for Silicon-Based Light-Emitting and Memory Devices"; IOP Publishing, Journal of Physics D: Applied Physics; 2013; p. 1-31.
(Continued)

*Primary Examiner* — Bac Au
(74) *Attorney, Agent, or Firm* — Eschweiler & Potashnik, LLC

(57) ABSTRACT

Some embodiments of the present disclosure provide an integrated circuit (IC) device including a metal-insulator-metal (MIM) capacitor structure. The MIM capacitor structure includes a lower metal capacitor electrode, an upper metal capacitor electrode, and a capacitor dielectric separating the lower metal capacitor electrode from the upper metal capacitor electrode. The capacitor dielectric is made up of an amorphous oxide/nitride matrix and a plurality of metal or metal oxide/nitride nano-particles that are randomly distributed over the volume of amorphous oxide/nitride matrix.

20 Claims, 8 Drawing Sheets

(51) Int. Cl.
  *H01L 21/02* (2006.01)
  *H01L 45/00* (2006.01)
  *H01L 29/88* (2006.01)

(52) U.S. Cl.
  CPC ...... *H01L 23/5223* (2013.01); *H01L 21/0214* (2013.01); *H01L 21/0217* (2013.01); *H01L 21/02164* (2013.01); *H01L 21/02178* (2013.01); *H01L 21/02181* (2013.01); *H01L 29/88* (2013.01); *H01L 45/08* (2013.01); *H01L 45/10* (2013.01)

(58) Field of Classification Search
  CPC ......... H01L 21/31641; H01L 27/10852; H01L 21/02178; H01L 2223/6672; H01L 27/1255; H01L 23/5223; H01L 23/642; H01L 27/0805; H01L 27/3265
  See application file for complete search history.

(56) References Cited

U.S. PATENT DOCUMENTS

| | | |
|---|---|---|
| 2005/0110115 A1 | 5/2005 | Kil et al. |
| 2006/0040457 A1 | 2/2006 | Lee et al. |
| 2009/0278211 A1 | 11/2009 | Kim et al. |
| 2012/0061799 A1 | 3/2012 | Hashim et al. |
| 2012/0248445 A1 | 10/2012 | De Paiva Martins et al. |
| 2013/0100577 A1 | 4/2013 | Popovici |

OTHER PUBLICATIONS

Ye Zhou, et al.; "Low Voltage Flexible Nonvolatile Memory with Gold Nanoparticles Embedded in Poly(methyl methacrylate)"; IOP Publishing, Nanotechnology; 2012; p. 1-7.

Lai Qi, et al.; "High-Dielectric-Constant Silver-Epoxy Composites as Embedded Dielectrics"; Advanced Materials; 2005, v.17, p. 1777-1781.

Cowell, E., et al., "Advancing MIM Electronics: Amorphous Metal Electrodes," Adv. Mater., vol. 23, No. 1, p. 74-78, Jan. 4, 2011.

Non-Final Office Action dated Feb. 3, 2016 for U.S. Appl. No. 14/316,910.

Notice of Allowance dated Aug. 31, 2016 for U.S. Appl. No. 14/316,910.

MIM/RRAM STRUCTURE WITH IMPROVED CAPACITANCE AND REDUCED LEAKAGE CURRENT

REFERENCE TO RELATED APPLICATION

This Application is a Divisional of U.S. application Ser. No. 14/316,910, filed on Jun. 27, 2014, the contents of which are hereby incorporated by reference in its entirety.

BACKGROUND

A capacitor is a passive two-terminal electrical component used to store energy electro-statically in an electric field. The forms of practical capacitors vary widely, but all contain at least two electrical conductors (electrodes) separated by a dielectric (insulator). Capacitors are widely used as parts of electrical circuits in many common electrical devices. For example, capacitors are widely used in electronic circuits for blocking direct current while allowing alternating current to pass, but can also be used to store data states, such as in a dynamic random access memory (DRAM) device.

For integrated circuits and for DRAM devices in particular, the use of metal-insulator-metal (MIM) capacitors has become widespread in recent years. These MIM capacitors are typically formed in back-end-of-line (BEOL) processing, after front-end-of line (FEOL) processing has been completed. In other words, MIM capacitors are formed in or over metal interconnect layers that extend in horizontal planes over a semiconductor substrate in which active devices have been formed. In addition to acting as capacitive elements, MIM capacitor structures are also utilized for resistive random access memory (RRAM) devices.

The present disclosure provides MIM capacitor devices, such as used in RRAM or diode devices for example, as well as methods of making and operating such devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
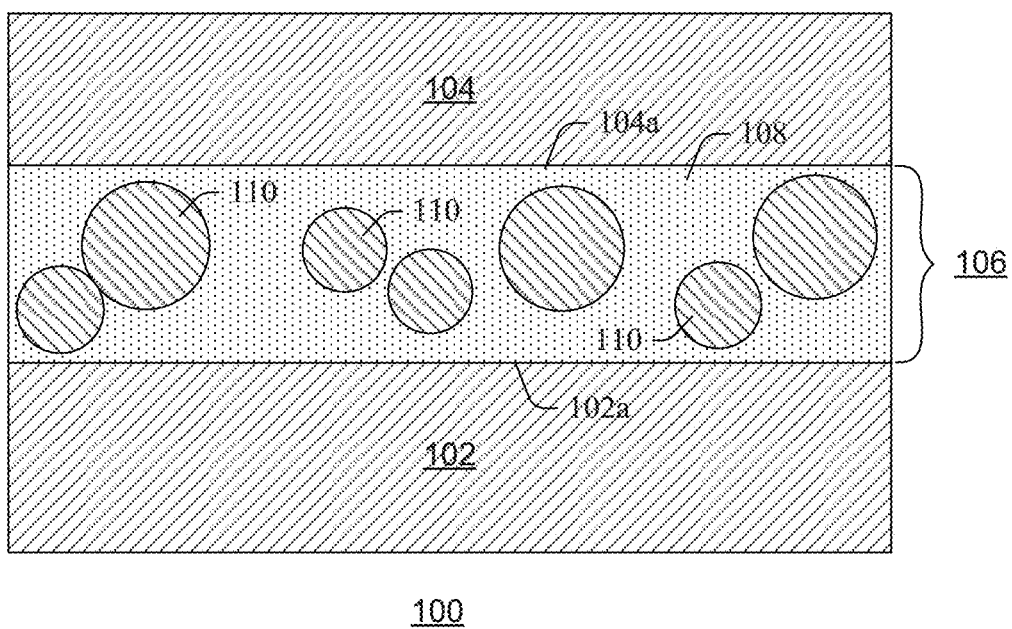
FIG. 1 illustrates an integrated circuit device that includes an MIM capacitor structure with an improved capacitor dielectric separating upper and lower capacitor electrodes.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Successive generations of MIM capacitors exhibit continually reduced or "thinned down" dielectric thicknesses, which helps provide higher density structures. However, as the capacitor dielectric of an MIM capacitor is "thinned down", the capacitance value of the MIM capacitor tends to be correspondingly reduced, which can lead to leakage current issues. For example, electrons can easily tunnel through sufficiently thin dielectric films, which can lead to excess power dissipation, circuit noise, and/or other undesired effects. To increase the dielectric constant, κ, and correspondingly increase the capacitance of MIM capacitors, this disclosure sets forth improved capacitor dielectric materials and techniques. These materials and techniques increase the capacitance of the disclosed devices while limiting current leakage between the upper and lower capacitor electrodes.

FIG. 1 illustrates a metal-insulator-metal (MIM) capacitor structure 100 included on an integrated circuit device in accordance with some embodiments. The structure 100 includes a lower metal capacitor electrode 102, an upper metal capacitor electrode 104, and a capacitor dielectric 106 separating the lower and upper metal capacitor electrodes 102, 104. To provide an increased dielectric constant, κ, the capacitor dielectric 106 is made up of an amorphous matrix made of oxide and/or nitride (oxide/nitride matrix) 108 and a plurality of metal or metal oxide/nitride nano-particles 110 that are randomly distributed over the volume of amorphous oxide/nitride matrix 108.

In typical implementations, the amorphous oxide/nitride matrix 108 extends continuously between the upper and lower metal capacitor electrodes 102, 104 so as to abut opposing faces 102a, 104a of upper and lower metal capacitor electrodes. Thus, although the distribution of nano-particles 110 is random in that the spacings between neighboring nano-particles can vary in a random manner from one pair of neighboring nano-particles to the next (e.g., one pair of nano-particles can be separated by a relatively small distance while the next pair of nano-particles can be spaced apart by a relatively large distance); this randomness is continuous throughout the entire volume of the amorphous oxide/nitride matrix 108 between the upper and lower capacitor electrodes 102, 104. Thus, aside from random artifacts, there is typically no definitive striation or alignment of nano-particles 110 in the amorphous oxide/nitride matrix 108. Compared to some other approaches where actual striations of nano-particles may be present, the disclosed continuously random distribution of nano-particles is believed to provide greater flexibility in materials and processes that can be used to form the devices. In addition, the disclosed techniques also use fewer process steps, which can limit process time and contaminants to which the device is exposed during manufacture.

The relative compositions of oxide/nitride matrix material 108 and nano-particles 110 can vary depending on the particular application. Typically, for applications that demand higher k values, more nano-particles tend to be present per a given unit volume of oxide/nitride matrix material—for example, the nano-particles 100 can make up 30% or 40% of the capacitor dielectric 106 by volume in some cases, with the remaining 60% to 70% being made up of oxide/nitride matrix 108. Conversely, for less demanding applications where lower-k values are desired, fewer nano-particles per a given unit volume of oxide/nitride material may be present—for example, the nano-particles 110 can make up 5% or 10% of the capacitor dielectric 106 by volume in other cases, where the remaining 90% to 95% being made up of oxide/nitride matrix 108. In some cases, κ values of between 100 and 400 may be achieved through the use of an amorphous oxide/nitride matrix with metal or metal oxide/nitride nano-particles embedded therein. However, the disclosed techniques can be tuned to achieve other suitable κ values for a wide variety of applications.

It will be appreciated that the amorphous oxide/nitride matrix 108 and metal or metal oxide/nitride nano-particles 110 can take a number of different forms, depending on the implementation. Some non-limiting examples of sizes and materials are now set forth. In some embodiments, the amorphous oxide/nitride matrix 108 is made up of amorphous $SiO_2$ or amorphous $Al_2O_3$ (other common dielectrics which could be fabricated by sputtering are applicable, such as $HfO_2$, SiON, $Si_3N_4$, etc.) Further, in some embodiments the amorphous oxide/nitride material 108 can have a thickness ranging between 50 angstroms and 1000 angstroms, although thicknesses can vary widely depending on the application.

In some embodiments, the metal or metal oxide/nitride nano-particles 110 have average diameters of less than 10 nm in size. For example, the metal or metal oxide/nitride nano-particles 110 can have average diameters ranging between 6 nm and 10 nm. In some embodiments, the metal or metal oxide/nitride nano-particles 110 include at least one of the following materials: Ti, Ta, Nb, Zr, or Hf.

Again, this capacitor dielectric 106 when formed in one or more of these configurations provides a high quality high-k dielectric layer, which can be manufactured in an efficient manner.

Figure 2:
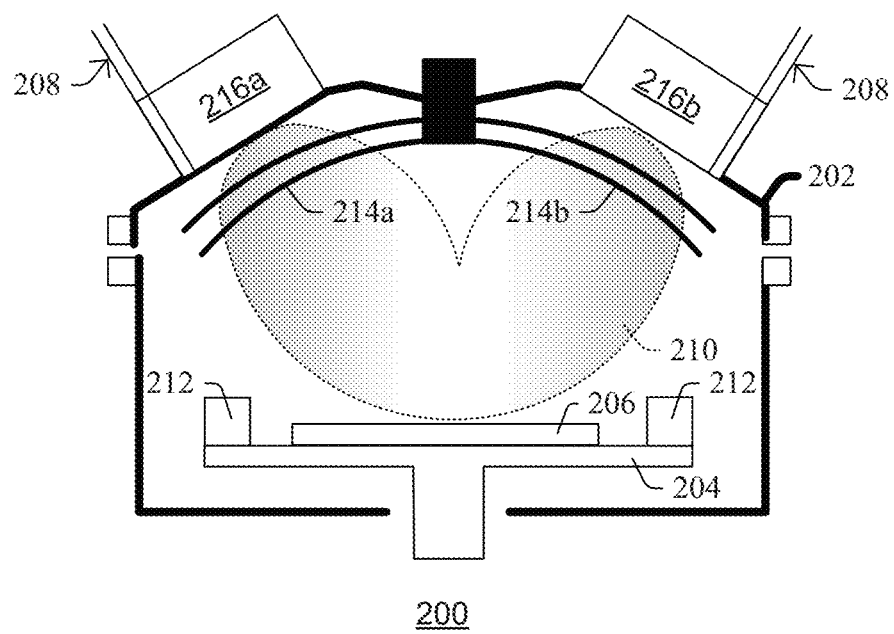
FIG. 2 illustrates a co-sputtering system that can be used to form the capacitor dielectrics described herein.

FIG. 2 shows an example of a co-sputtering tool 200 that aids in the formation of the capacitor dielectric (106, FIG. 1) in accordance with some embodiments. The co-sputtering tool 200 includes a vacuum chamber 202 that surrounds a workpiece chuck 204 on which a semiconductor wafer or other semiconductor workpiece 206 is arranged. A gas delivery system 208, such as one or more pipes with valves, can deliver a sputtering gas such as oxygen and/or nitrogen into the vacuum chamber 202 after a vacuum pump has pumped the vacuum chamber 202 down toward vacuum. After the vacuum chamber 202 has been pumped down towards vacuum and the sputtering gas has been flowed with a semiconductor workpiece 206 in place, a plasma 210 is ignited within the vacuum chamber 202. This plasma 210 is shaped or contained by one or more magnets 212 disposed about an edge of the workpiece chuck 204. First and second shutters 214a, 214b are opened to expose first and second sputtering targets 216a, 216b to the plasma 210, which concurrently ejects material from the first and second sputtering targets 216a, 216b so the ejected material is deposited on the surface of the workpiece 206. The amount of ejection from the first and second sputtering targets 216a, 216b can be set by tuning a bias applied to each target, which controls the amount and/or velocity of electrons striking each target.

In some embodiments, the first sputtering target 216a can be an oxide/nitride target, or pure element target such as Si, and the second sputtering target 216b is a metal target. Thus, by co-sputtering material from the first and second targets 216a, 216b; oxide/nitride material and metal nano-particles or metal oxide/nitride nano-particles can be concurrently deposited on an exposed surface of the semiconductor workpiece 206. By tuning first and second biases applied to the first and second sputtering targets 216a, 216b, respectively, the relative proportions of amorphous oxide/nitride material and metal or metal oxide/nitride nanoparticle material can be tuned to desired levels within the formed capacitor dielectric. Additionally, the working atmosphere (forming gas such as oxygen/argon or nitrogen/oxygen/argon) of reactive gases can also determine the oxidation status of dielectric materials. Further, due to the concurrent co-sputtering of material from the first and second targets 216a, 216b; the resultant dielectric layer that is formed exhibits a continuously random arrangement of nano-particles through the entire volume of the capacitor dielectric layer. By forming the capacitor dielectric layer in a single deposition, the amount of workpiece handing can be reduced, which can correspondingly reduce the risk of defects, and the cleaning requirements of the vacuum chamber can also be reduced somewhat. In addition, because co-sputtering can be carried out at relatively low temperatures compared to some other deposition techniques, the present disclosure can offer advantages from a thermal budget viewpoint, which is particularly desirable in BEOL processing.

In some embodiments, for example, the first sputtering target 216a can comprise a titanium (Ti) target with a diameter of approximately 2 inches; and the second sputtering target 216b can comprise an $AlO_3$ target with a diameter of approximately 2 inches. A low DC power (e.g., ranging between approximately 2 Watts (W) and approximately 30 W), can be applied to the Ti target, while a high RF power (e.g., ranging between approximately 50 W and approximately 200 W) can be applied to the $AlO_3$ target while a mixture of $Ar/O_2$ gas is supplied to the vacuum chamber. This configuration can be used to form $TiO_x$ nano-particles embedded in an $AlO_2$ oxide matrix.

Figure 3:
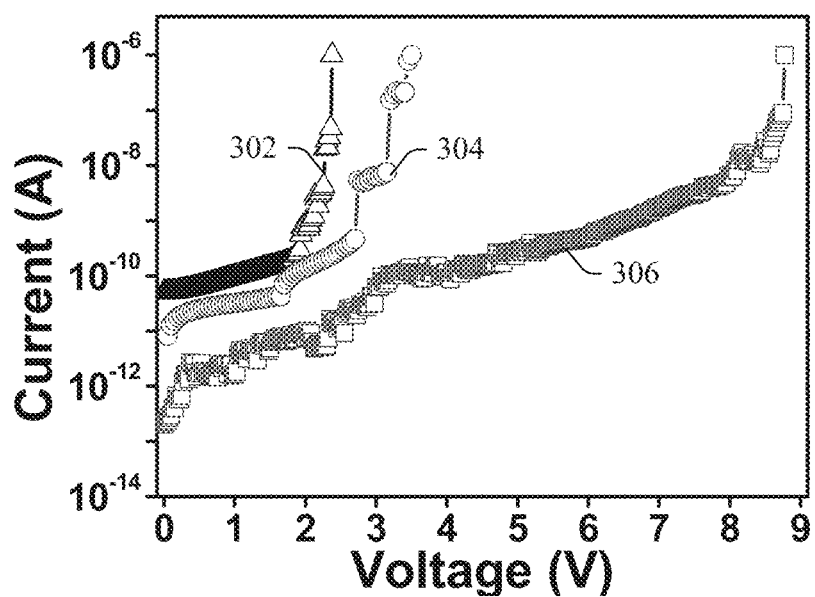
FIG. 3 illustrates a plot illustrating leakage current for an MIM capacitor as a function of DC bias used to sputter nano-particles on the dielectric layer.

FIG. 3 shows a chart 300 depicting leakage current (y-axis) as a function of voltage applied to the capacitor dielectric (x-axis) for several different capacitive dielectric layers formed by co-sputtering. The first curve 302 represents a capacitor dielectric layer formed while a first DC sputtering power (e.g., 10 W) is applied to the metal, pure element or metal oxide/nitride target used to generate nano-particles, the second curve represents a capacitor dielectric layer formed while a second DC sputtering power (e.g., 15 W) is applied to the metal, pure element or metal oxide/ nitride target, and the third curve represents a capacitor dielectric layer formed while a third DC sputtering power (e.g., 20 W) is applied to the metal, pure element or metal oxide/nitride target. Aside from using different biases applied to the metal, pure element or metal oxide/nitride target, other process conditions, including the DC bias applied to the metal or pure element target, remain unchanged. As can be seen from this family of curves, as the DC bias applied to the metal or pure element sputtering target is increased, the leakage current of the dielectric tends to be reduced. This is because as the DC bias is increased, more nano-particles and interfaces are sputtered into the amorphous oxide/nitride matrix per given unit volume, which tends to reduce current leakage of the resultant capacitor dielectric.

Figure 4:
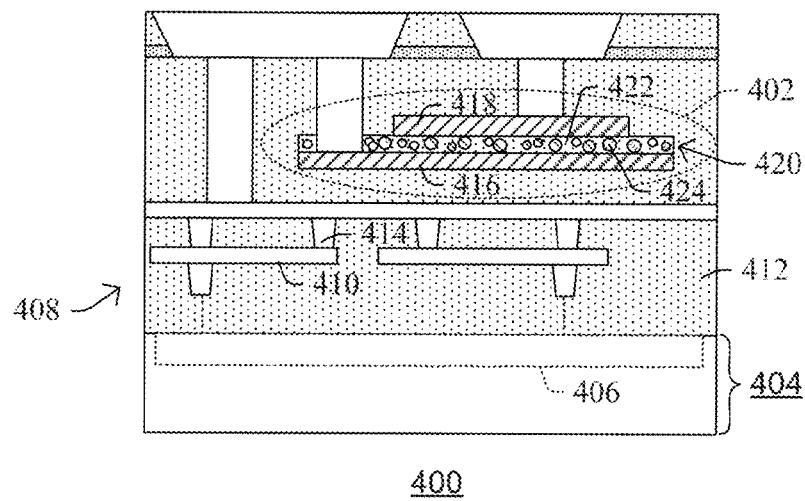
FIG. 4 illustrates a cross-sectional view of a MIM capacitor in accordance with some embodiments.
Figure 5:
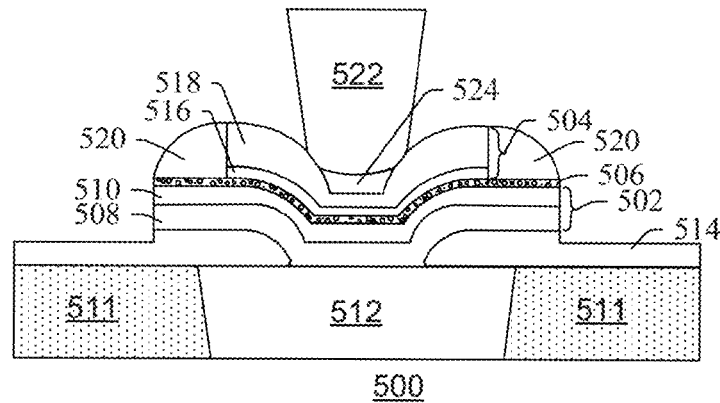
FIG. 5 illustrates a cross-sectional view of an RRAM cell in accordance with some embodiments.
Figure 6:
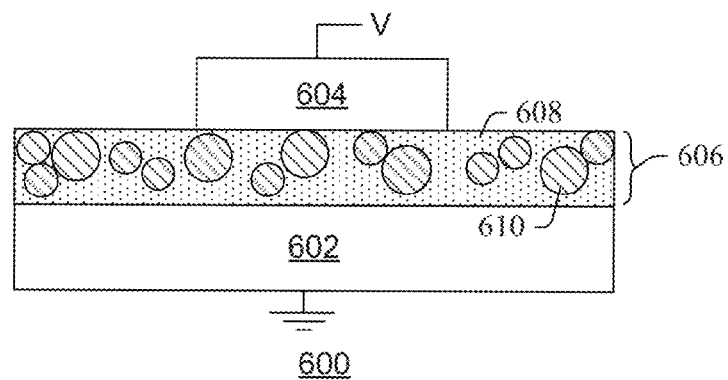
FIG. 6 illustrates a cross-sectional view of MIM diode in accordance with some embodiments.

The disclosed capacitor dielectric layers (e.g., FIG. 1, 106) can be used in a variety of devices. FIGS. 4-6, which are now described below, show some illustrative examples.

FIG. 4 illustrates a portion of an integrated circuit 400 which includes an MIM capacitor 402 that makes use of a capacitor dielectric layer as set forth above. As shown, the integrated circuit 400 includes a semiconductor substrate 404, such as a bulk silicon substrate or silicon on insulator (SOI) substrate. A plurality of semiconductor devices are disposed in an active region 406 within the substrate 404, and can include active devices, such as CMOS transistors or bipolar junction transistors (BJTs) for example, or passive devices, such as resistors, capacitors, diodes, or inductors for example. An interconnect structure 408, which comprises a plurality of conductive layers 410 and insulating layers 412 which are formed one over another in alternating fashion and are which coupled by contacts and/or vias 414, is formed over the substrate 404 to couple semiconductor devices to one another. In many embodiments, at least some of the conductive layers 410 are made of copper, and the insulating layers 412 are a low-k or extreme low-k dielectric material.

The MIM capacitor structure 402 is formed within or over the interconnect structure 408, and includes a lower electrode 416 and an upper electrode 418, which are separated from one another by a capacitor dielectric 420. The capacitor dielectric 420 is made up of an amorphous oxide/nitride matrix 422 and a plurality of metal or metal oxide/nitride nano-particles 424 that are randomly distributed over the entire volume of amorphous oxide/nitride matrix 422.

In some embodiments, the lower electrode 416 is a metal electrode or nitride electrode, such as a TiN electrode, having a thickness of approximately 400 angstroms. Similarly, in some embodiments, the upper electrode 418 is a metal electrode or nitride electrode, such as a TiN electrode, having a thickness that is greater than or equal to that of the lower electrode 416. For example, in some embodiments, the upper electrode can have a thickness of approximately 600 angstroms.

FIG. 5 illustrates a portion of another integrated circuit which includes a resistive random access memory (RRAM) cell 500 that makes use of a capacitor dielectric layer as set forth above. Although substrate and interconnect structure are not explicitly shown in FIG. 5, it will be appreciated that the RRAM cell 500 can be formed within or over an interconnect structure, similar to as described in FIG. 4. Analogous to previous structures, the RRAM cell 500 includes a lower electrode 502 and an upper electrode 504, which are separated from one another by a capacitor dielectric 506.

The lower electrode 502 includes a first lower electrode layer 508, such as a TaN layer having a thickness of approximately 200 angstroms, and a second lower electrode layer 510 arranged over the first lower electrode layer 508. The second lower electrode layer 510 can be a TiN layer having a thickness of approximately 100 angstroms in some embodiments. The lower electrode 502 can have a central region that abuts a conductive interconnect region 512, such as a copper interconnect region arranged within an extreme low k dielectric layer 511, and can have peripheral regions that are spaced apart from the conductive interconnect region 512 by a protective barrier layer 514, such as a SiC layer having a thickness of approximately 300 angstroms. The capacitor dielectric 506 in this embodiment can be approximately 50 angstroms thick in some implementations.

The upper electrode 504 includes a first upper electrode layer 516, such as a Ti layer having a thickness of approximately 50 angstroms, and a second upper electrode layer 518 overlying the first upper electrode layer 516. The second upper electrode layer 518 in some embodiments can be a TaN layer having a thickness of approximately 250 angstroms. Spacers 520, such as SiN spacers, can be arranged about sidewalls of the upper electrode 504 and over peripheral regions of the capacitor dielectric 506. An upper electrode via 522, such as a copper via, can be connected to the upper electrode 504 through an interface layer 524, such as an SiON layer, to help establish an ohmic contact.

FIG. 6 illustrates a portion of another integrated circuit which includes an MIM diode 600 that makes use of a capacitor dielectric layer as set forth above. Although substrate and interconnect structure are not explicitly shown in FIG. 6, it will be appreciated that the MIM diode 600 can be formed within or over an interconnect structure, similar to as described and described in FIG. 4. Analogous to previous structures, the MIM diode 600 includes a lower electrode 602, which can be a thin strip of a first metal that acts as a cathode for example, and an upper electrode 604, which can be a thin strip of a second metal that acts as an anode for example. The first and second metals are typically different, and by changing the arrangement of these metals, the locations of the anode and cathode can be flipped (e.g., lower electrode 602 can act as an anode and the upper electrode 604 can act as a cathode in some embodiments). The lower and upper electrodes 602, 604 are separated from one another by a capacitor dielectric 606, which includes an amorphous oxide/nitride matrix 608 and a plurality of metal or metal oxide/nitride nano-particles 610 that are randomly distributed over the entire volume of amorphous oxide/nitride matrix 608. The thickness of the capacitor dielectric 606 and concentration of nano-particles therein is tuned to promote tunneling of carriers (e.g., electrons) for precise diode control.

Figure 7:
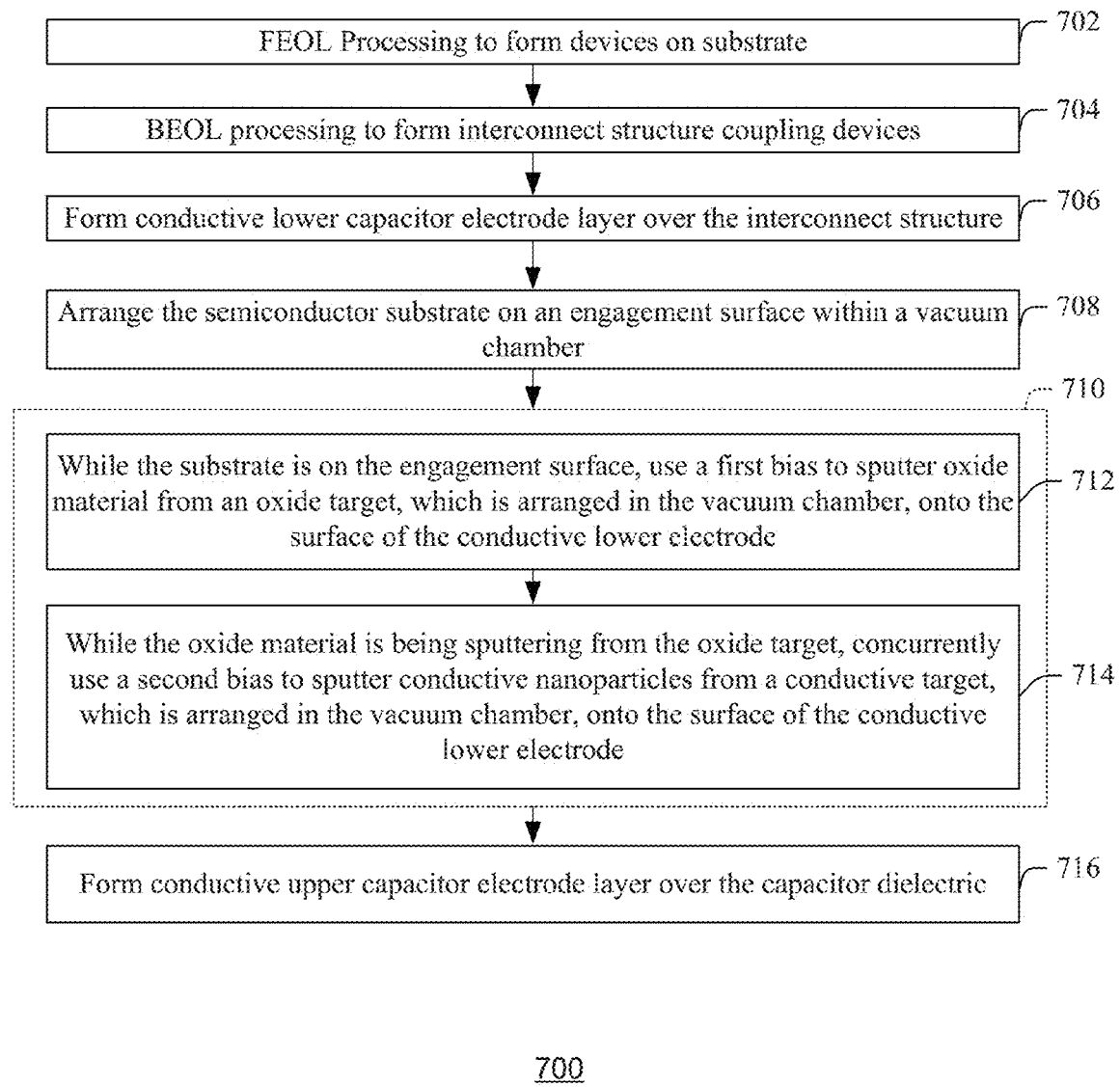
FIG. 7-8 show examples of methods in flowchart format in accordance with some embodiments of the present disclosure.

FIG. 7 shows an example of a manufacturing method 700 in flowchart format in accordance with some embodiments of the present disclosure. Although this method 700 and other methods disclosed herein may be illustrated and/or described as a series of acts or steps, it will be appreciated that, in some instances, illustrated and/or described acts can be performed in different orders from what is illustrated and/or described. Further, one or more illustrated and/or described acts may be performed concurrently, while some illustrated and/or described acts may be carried out in sub-acts or sub-steps, which can similarly be re-ordered with regards to other illustrated and/or described acts or subs-acts in some embodiments.

Method 700 starts at 702, where front end of line (FEOL) processing is used to form one or more devices on a substrate. In 704, back end of line (BEOL) processing is used to form an interconnect structure that couples the devices to one another or another wafer, chip, or board. In 706, a conductive lower capacitor electrode layer is formed over or within the interconnect structure. In 708, after the conductive lower capacitor electrode layer is formed, the substrate is placed on an engagement surface, such as on a wafer chuck, within a vacuum chamber. In 710, a co-sputtering operation is performed to form a capacitor dielectric layer over the conductive lower capacitor electrode layer. This co-sputtering operation includes applying a first bias to sputter oxide/nitride material from a first target in 712, and also includes concurrently applying a second bias to sputter conductive nano-particles from a second target in 714, thereby forming the capacitor dielectric layer over the lower capacitor electrode. In 716, a conductive upper capacitor electrode layer is then formed over the capacitor dielectric layer.

Figure 8:
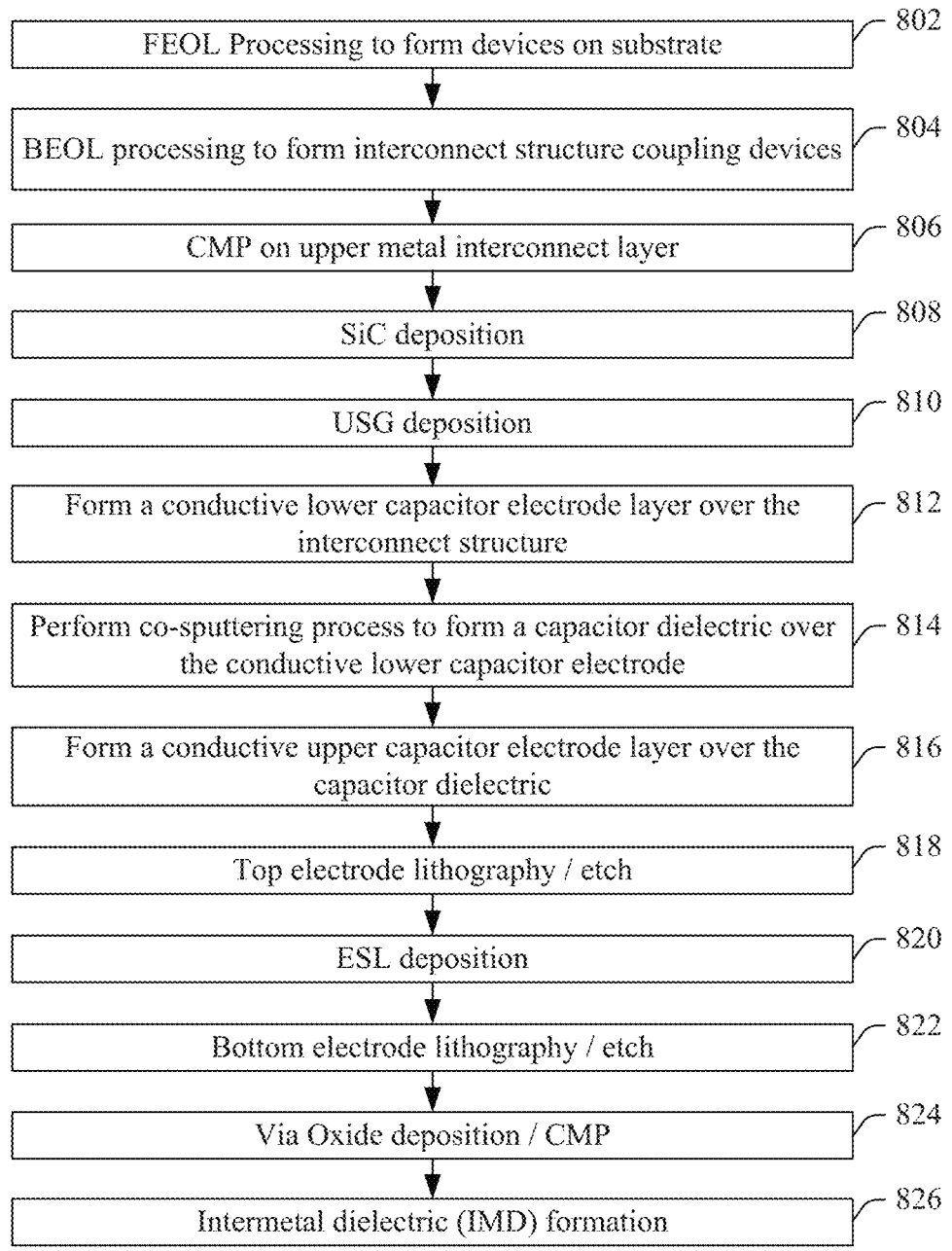

FIG. 8 shows another a manufacturing method 800 for making an MIM capacitor structure in accordance with some embodiments. One example consistent with FIG. 8's manufacturing flow is now described with regards to FIGS. 9-15. In particular, FIG. 9-15 show a series of cross-sectional views that depict incremental manufacturing stages consistent with some examples of FIG. 8's methodology.

Figure 9:
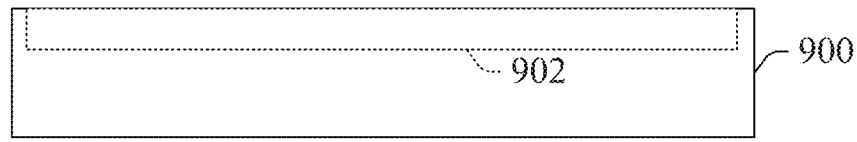
FIGS. 9-15 depict a series of incremental manufacturing steps as a series of cross-sectional views, which are consistent with some implementations of FIG. 8's flowchart.

In FIG. 9, which corresponds to an example of block 802 of FIG. 8, FEOL processing is used to form one or more devices on an active area 902 of a substrate 900. For ease of viewing, FIG. 9 does not show detailed semiconductor device structures, but it will be appreciated that these devices structures can take the form of active devices, such as transistors, or passive devices, such as diodes, resistors, capacitors, inductors, and the like. Depending on the implementation, the substrate 900 can be a bulk semiconductor (e.g., silicon) wafer, a binary compound substrate (e.g., a GaAs wafer), a ternary compound substrate (e.g., AlGaAs), or a higher order compound substrate, among others. Further, substrate 900 can also take the form of a silicon-on-insulator (SOI) wafer, which includes a buried oxide (BOX) layer formed over a handle wafer, and a relatively thin surface layer of semiconductor material arranged over the BOX. The substrate 900 can include conductive layers, such as metal or doped polysilicon; semiconductor layers, such as doped or intrinsic silicon; insulating materials, such as SiO2, low-k dielectrics, or high-k dielectrics; or organic materials, among others. In some embodiments, the substrate 900 can also include multiple wafers or dies which are stacked or otherwise adhered together. The substrate 900 can include wafers which are cut from a silicon ingot, and/or any other type of semiconductor/non-semiconductor and/or deposited or grown (e.g., epitaxial) layers formed on an underlying substrate.

Figure 10:
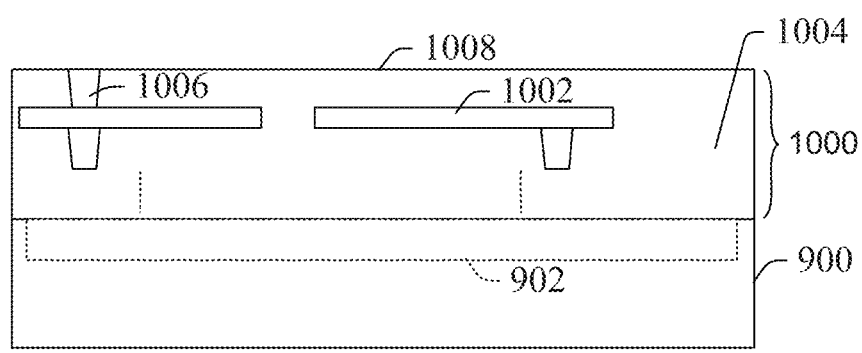

In FIG. 10, which corresponds to structure consistent with blocks 804-806 of FIG. 8, BEOL processing is used to form an interconnect structure 1000 that operably couples the devices of active region 902 to one another or to another chip or to a circuit board. The interconnect structure 1000 is made up of a number of conductive layers 1002 and insulating layers 1004 which are formed one over another in alternating fashion and are which coupled by contacts and/or vias 1006. In many embodiments, at least some of the conductive layers 1002 are made of copper, and the insulating layers 1004 are a low-k or extreme low-k dielectric material. A chemical mechanical polishing (CMP) operation is applied to planarize an upper surface 1008 of the interconnect structure.

Figure 11:
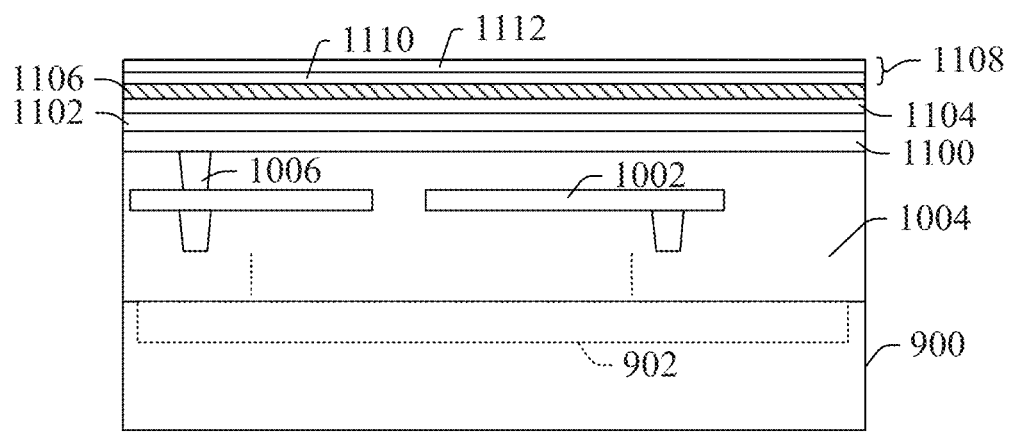

In FIG. 11, which corresponds to a structure consistent with 808-816 of FIG. 8, a protective SiC layer 1100 is formed over the planarized metal interconnect layer 1008, and an undoped silicate glass (USG) layer 1102 is formed over the SiC layer 1100. A lower capacitor electrode 1104, such as a TiN layer, is formed, for example by plasma vapor deposition (PVD), over the USG layer 1102. A co-sputtering process is then used to form a capacitor dielectric 1106 over the lower capacitor electrode 1104. In particular, this co-sputtering operation applies a first bias to sputter oxide/nitride material from a first target, and also concurrently applies a second bias to sputter conductive nano-particles from a second target in 714, thereby forming the capacitor dielectric 1106 which exhibits an amorphous oxide/nitride matrix with metal nano-particles arranged randomly therein. An upper capacitor electrode 1108, such as a TiN layer 1110 and/or TaN layer 1112, is formed, for example by PVD, over the capacitor dielectric 1106.

Figure 12:
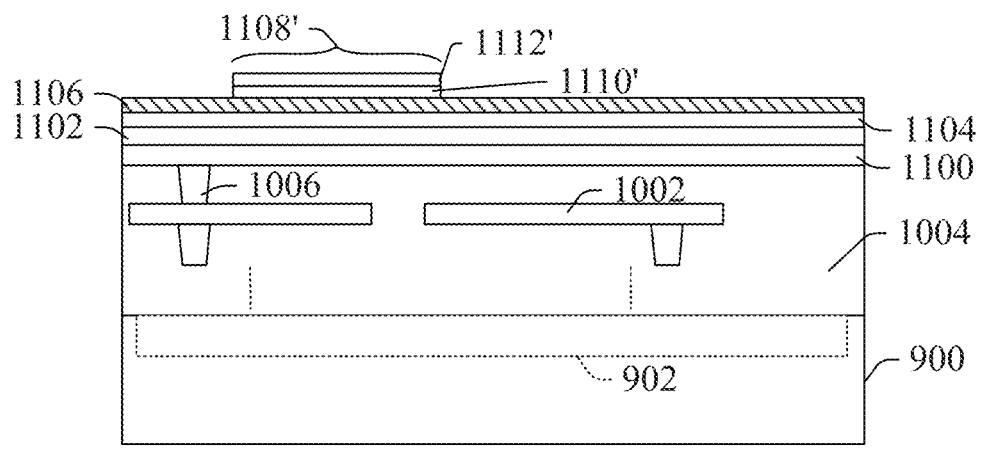

In FIG. 12, which corresponds to block 818 of FIG. 8, the upper electrode 1108' is patterned. To achieve this patterning, a photoresist layer is typically formed over the upper capacitor electrode 1108, for example by a spin-coating process. A reticle or mask is then positioned over the photoresist layer, and light is directed onto the photoresist layer through the reticle or mask to selectively expose some regions of the photoresist to the light while other regions of the photoresist are blocked from the light by opaque features on the reticle or mask. The photoresist is then developed to remove the exposed (or un-exposed) regions of photoresist, depending on whether positive (or negative) photoresist is used. In the case of FIG. 12, the remaining portions of photoresist after developing are left in place over the upper electrode 1108', and then an etch is carried out with the patterned photoresist in place to form upper electrode 1108'.

Figure 13:
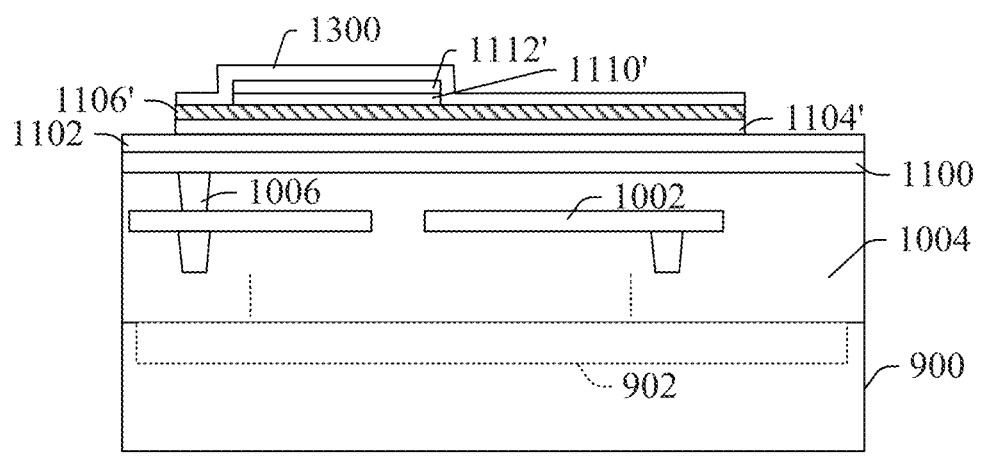
Figure 14:
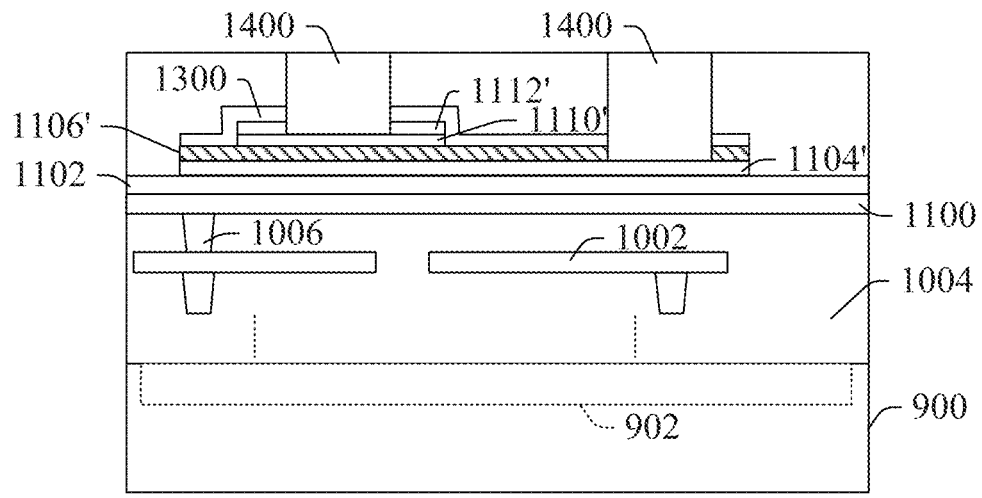

In FIG. 13, which corresponds to block 820-822 of FIG. 8, a conformal etch stop layer 1300 (ESL) is formed over the patterned top electrode. This conformal ESL 1300 can comprise SiON or SiN, for example. The capacitor dielectric 1106' and bottom electrode 1104' are then patterned. To achieve this patterning, a photoresist layer is typically formed over the bottom capacitor dielectric 1106, for example by a spin-coating process. A reticle or mask is then positioned over the photoresist layer, and light is directed onto the photoresist layer through the reticle or mask to selectively expose some regions of the photoresist to the light while other regions of the photoresist are blocked from the light by opaque features on the reticle or mask. The photoresist is then developed to remove the exposed (or un-exposed) regions of photoresist, depending on whether positive (or negative) photoresist is used. In the case of FIG. 14, the remaining portions of photoresist after developing are left in place over the capacitor dielectric 1106', and then an etch is carried out with the patterned photoresist in place to form capacitor dielectric 1106' and bottom electrode 1104'.

In FIG. 14, which corresponds to 824 of FIG. 8, a dielectric is formed over the structure, vias 1400 are formed to connect to the upper and lower electrodes, and CMP is then performed.

Figure 15:
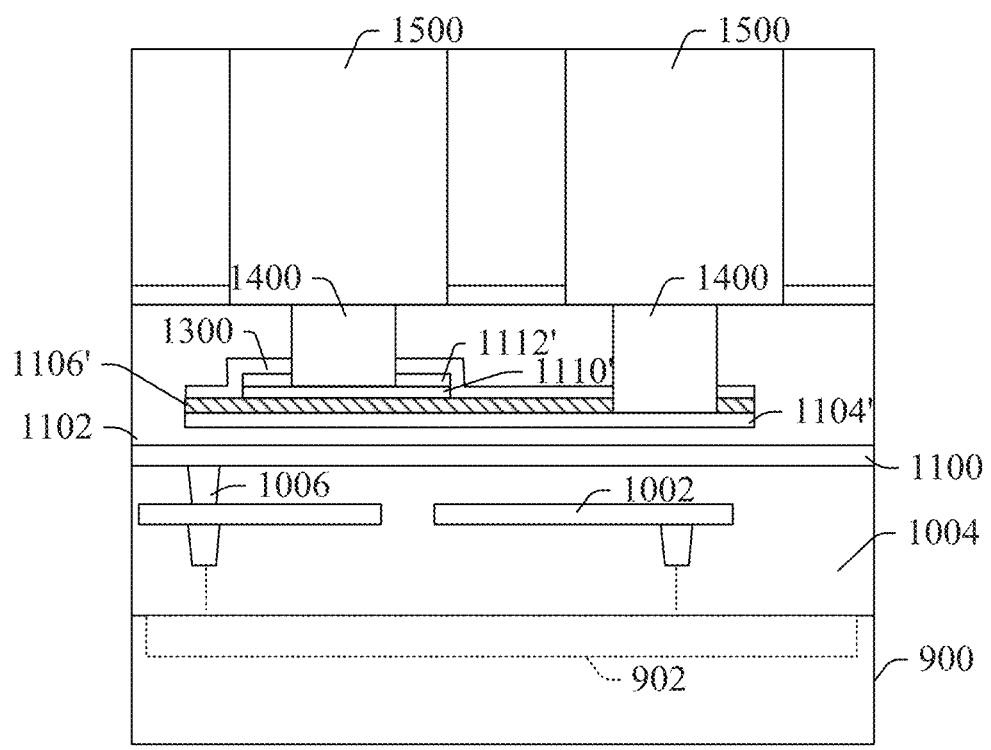

In FIG. 15, which corresponds to 826 of FIG. 8, an intermetal dielectric is formed, and additional vias 1500 are also formed.

Some embodiments of the present disclosure provide an integrated circuit (IC) device including a metal-insulator-metal (MIM) capacitor structure. The MIM capacitor structure includes a lower metal capacitor electrode, an upper metal capacitor electrode, and a capacitor dielectric separating the lower metal capacitor electrode from the upper metal capacitor electrode. The capacitor dielectric is made up of an amorphous oxide/nitride matrix and a plurality of metal or metal nitride nano-particles that are randomly distributed over a volume of the amorphous oxide/nitride matrix.

Other embodiments of the present disclosure provide a method of forming a MIM capacitor. In this method, a semiconductor substrate is provided with a plurality of semiconductor devices arranged thereon. An interconnect structure, which comprises a plurality of conductive and insulating layers that are formed one over another in alternating fashion, is formed over the substrate to couple semiconductor devices to one another. A conductive lower capacitor electrode layer is formed over the interconnect structure. A co-sputtering process is performed to form a capacitor dielectric over the conductive lower capacitor electrode. A conductive upper capacitor electrode layer is formed over the capacitor dielectric.

Still other embodiments relate to an integrated circuit (IC). The IC includes a lower TiN capacitor electrode, a dielectric layer, and an upper TiN electrode. The dielectric layer is over and contacts the lower TiN electrode. Further, the dielectric layer comprises an amorphous nitride matrix and a plurality of metal or metal oxide or metal nitride nano-particles. The amorphous nitride matrix has a thickness less than about one hundred angstroms and a dielectric constant greater than about twenty. The metal or metal oxide or metal nitride nano-particles are randomly distributed over an entire volume of the amorphous nitride matrix and have individual diameters less than about ten nanometers. The upper TiN electrode is over and contacts the dielectric layer Still other embodiments relate to an integrated circuit (IC) device including a metal-insulator-metal (MIM) capacitor structure. The MIM capacitor structure includes a lower TiN capacitor electrode; an upper TiN capacitor electrode; and an amorphous SiO2 capacitor dielectric. The capacitor dielectric has a thickness of less than approximately one hundred Angstroms, and separates the lower TiN electrode from the upper TiN electrode. The capacitor dielectric has a dielectric constant of greater than one-hundred. A plurality of metal or metal nitride nano-particles, which have individual diameters of less than approximately ten nanometers, are randomly distributed over an entire volume of amorphous SiO2 capacitor dielectric between the upper and lower TiN capacitor electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) device including a metal-insulator-metal (MIM) capacitor structure comprising:
a lower metal capacitor electrode;
an upper metal capacitor electrode; and
a capacitor dielectric separating the lower metal capacitor electrode from the upper metal capacitor electrode, wherein the capacitor dielectric is made up of an amorphous oxide or amorphous nitride matrix and a plurality of metal or metal nitride nano-particles that are randomly distributed over a volume of the amorphous oxide or amorphous nitride matrix.

2. The IC device of claim 1, wherein the amorphous oxide or amorphous nitride matrix extends continuously between the upper and lower metal capacitor electrodes so as to abut opposing inner faces of the upper and lower metal capacitor electrodes.

3. The IC device of claim 1, wherein the metal or metal nitride nano-particles have average diameters of less than 10 nanometers in size.

4. The IC device of claim 1, wherein the metal or metal nitride nano-particles have average diameters ranging between 2 nanometers and 10 nanometers.

5. The IC device of claim 1, wherein the amorphous oxide or amorphous nitride matrix is made up of amorphous $SiO_2$, amorphous $Al_2O_3$, amorphous $HfO_2$, amorphous SiON, or amorphous $Si_3N_4$.

6. The IC device of claim 1, wherein the metal or metal nitride nano-particles include Ti, Ta, Nb, Zr, Hf, or a combination of the foregoing.

7. The IC device of claim 1, wherein the lower metal capacitor electrode and the upper metal capacitor electrode respectively define electrodes of a resistive random access memory (RRAM) cell or respectively define an anode of a diode and a cathode of a diode.

8. The IC device of claim 1, wherein the IC device is on a semiconductor substrate that includes a plurality of active devices, wherein the active devices are coupled by a series of horizontal metal layers arranged over the semiconductor substrate to establish an interconnect structure, and wherein the MIM capacitor structure is formed within or over the interconnect structure.

9. An integrated circuit (IC) comprising:
a lower TiN electrode;
a dielectric layer over and contacting the lower TiN electrode, wherein the dielectric layer comprises an amorphous nitride matrix and a plurality of metal or metal oxide or metal nitride nano-particles, wherein the amorphous nitride matrix has a thickness less than about one hundred angstroms and a dielectric constant greater than about twenty, and wherein the metal or metal oxide or metal nitride nano-particles are randomly distributed over an entire volume of the amorphous nitride matrix and have individual diameters less than about ten nanometers; and
an upper TiN electrode over and contacting the dielectric layer.

10. The IC of claim 9, wherein the metal or metal oxide or metal nitride nano-particles include Ti, Zr, Hr, or a combination of the foregoing.

11. The IC of claim 9, wherein spacing between neighboring nano-particles in the amorphous nitride matrix varies randomly.

12. The IC of claim 9, wherein sizes of the metal or metal oxide or metal nitride nano-particles vary over the entire volume of the amorphous nitride matrix.

13. The IC of claim 9, wherein the metal or metal oxide or metal nitride nano-particles make up about 30-40 percent of the entire volume of the dielectric layer, and wherein the amorphous nitride matrix makes up a remaining percentage of the entire volume of the dielectric layer.

14. The IC of claim 9, further comprising:
a semiconductor substrate; and
an interconnect structure over the semiconductor substrate, wherein the interconnect structure comprises a second dielectric layer and an alternating stack of conductive layers and vias in the second dielectric layer, and wherein the upper and lower TiN electrodes and the dielectric layer are in the interconnect structure.

15. The IC of claim 14, wherein the lower TiN electrode and the dielectric layer have the same width, wherein the lower TiN electrode has a pair of outer sidewalls on opposite sides of the lower TiN electrode, wherein the outer sidewalls of the lower TiN electrode are respectively aligned with outer sidewalls of the dielectric layer, and wherein the upper TiN electrode is spaced between the outer sidewalls of the lower TiN electrode.

16. The IC of claim 9, further comprising:
a second dielectric layer;
a conductive interconnect recessed into the second dielectric layer, such that a top surface of the conductive interconnect is even with a top surface of the second dielectric layer; and
a third dielectric layer over the second dielectric layer and the conductive interconnect, wherein the third dielectric layer is a different material than the second dielectric layer, and wherein the lower TiN electrode overhangs the third dielectric layer and extends through the third dielectric layer to contact with the conductive interconnect.

17. The IC of claim 16, wherein the dielectric layer has a first sidewall, wherein the upper TiN electrode has a second sidewall neighboring the first sidewall, and wherein the IC further comprises:

a spacer over and contacting the dielectric layer, between the first and second sidewalls.

18. An integrated circuit (IC) device including a metal-insulator-metal (MIM) capacitor structure comprising:
a lower TiN capacitor electrode;
an upper TiN capacitor electrode;
an amorphous $SiO_2$ capacitor dielectric separating the lower TiN capacitor electrode from the upper TiN capacitor electrode, wherein the amorphous $SiO_2$ capacitor dielectric has a thickness of less than about one hundred angstroms and has a dielectric constant of greater than about twenty; and
a plurality of metal or metal nitride nano-particles randomly distributed over an entire volume of the amorphous SiO2 capacitor dielectric between the upper and lower TiN capacitor electrodes, wherein the metal or metal nitride nano-particles have individual diameters of less than about ten nanometers.

19. The IC device of claim 18, wherein the metal or metal nitride nano-particles include Ti, Zr, Hf, or a combination of the foregoing.

20. The IC device of claim 18, wherein spacing between neighboring metal or metal nitride nano-particles in the amorphous $SiO_2$ capacitor dielectric varies randomly, and wherein sizes of the metal or metal nitride nano-particles vary over the entire volume of the amorphous $SiO_2$ capacitor dielectric.

* * * * *